United States Patent [19]
Winterer et al.

[11] Patent Number: 6,058,020
[45] Date of Patent: May 2, 2000

[54] COMPONENT HOUSING FOR SURFACE MOUNTING OF A SEMICONDUCTOR COMPONENT

[75] Inventors: Jürgen Winterer, Nürnberg; Gottfried Beer, Nittendorf; Bernd Stadler, Donaustauf, all of Germany

[73] Assignee: Siemens Aktiengesellschaft, Munich, Germany

[21] Appl. No.: 09/221,787

[22] Filed: Dec. 28, 1998

Related U.S. Application Data

[63] Continuation of application No. PCT/DE97/01358, Jun. 27, 1997.

[51] Int. Cl.[7] .............................. H05K 7/02; H01L 41/053
[52] U.S. Cl. ..................... 361/767; 361/760; 361/773; 361/783; 361/808; 257/696; 174/52.1; 174/52.2; 310/340; 310/348
[58] Field of Search ..................................... 361/760, 767, 361/768, 773, 783, 807, 808; 310/313 R, 340, 348; 257/696; 174/52.1, 52.2

[56] References Cited

U.S. PATENT DOCUMENTS

| | | | |
|---|---|---|---|
| 4,330,683 | 5/1982 | Parker | 257/696 |
| 4,985,807 | 1/1991 | De Mari | 361/773 |
| 5,157,480 | 10/1992 | McShane et al. | 257/696 |
| 5,185,550 | 2/1993 | Morita et al. | 310/348 |
| 5,273,440 | 12/1993 | Ashman et al. | 439/71 |
| 5,586,010 | 12/1996 | Murtuza et al. | 361/767 |

FOREIGN PATENT DOCUMENTS

| | | |
|---|---|---|
| 0 409 257 A2 | 1/1991 | European Pat. Off. |
| 60-224263 | 11/1985 | Japan. |
| 7-106464 | 4/1995 | Japan. |

OTHER PUBLICATIONS

"High Density Chip Carrier With Protected Leads", IBM Technical Disclosure Bulletin, vol. 31, No. 2, Jul. 1988.

*Primary Examiner*—Leo P. Picard
*Assistant Examiner*—John B. Vigushin
*Attorney, Agent, or Firm*—Herbert L. Lerner; Laurence A. Greenberg; Werner H. Stemer

[57] ABSTRACT

A component housing for surface mounting of a semiconductor component on a component-mounting surface of a printed circuit board. The component housing including a chip carrier made of an electrically insulating material and having an approximately planar chip carrier area, a semiconductor chip, preferably having an integrated electronic circuit, secured on the chip carrier area, and electrode terminals having a surface-mountable configuration. The electrode terminals penetrating through the chip carrier and electrically connected to the semiconductor chip. A distance between the component-mounting surface of the printed circuit board and outer delimiting areas of the chip carrier which face the component-mounting surface of the printed circuit board increases continuously from an edge region to a central region of the chip carrier.

10 Claims, 1 Drawing Sheet

COMPONENT HOUSING FOR SURFACE MOUNTING OF A SEMICONDUCTOR COMPONENT

CROSS-REFERENCE TO RELATED APPLICATION

This is a continuation of copending International Application PCT/DE97/01358, filed Jun. 27, 1997, which designated the United States.

BACKGROUND OF THE INVENTION

1. Field of the Invention

The invention relates to a component housing having a mounting plane for surface mounting a semiconductor component on the component-mounting surface of a printed circuit board. The component housing includes a chip carrier, which has an approximately planar chip carrier area and is composed in particular of electrically insulating material, a semiconductor chip, preferably having an integrated electronic circuit, is secured on the chip carrier area, and electrode terminals having a surface-mountable configuration. The electrode terminals penetrate through the chip carrier and are electrically connected to the semiconductor chip.

Such a surface mounting configuration, which has also been disclosed as a Surface Mounted Design (SMD) configuration, enables the application of an electronic component on a circuit board in a manner that is particularly space-saving and affords a low structural height. In this form of mounting, the component terminals are no longer inserted into holes in the printed circuit board, as in the case of plug-in mounting, but rather are placed onto pads on the printed circuit board and soldered there. Components for surface mounting can be smaller than for plug-in mounting since hole and soldering-land diameters of the printed circuit board no longer determine the contact spacing of the terminals. Furthermore, the holes which are necessary only for component-mounting are dispensed with on the printed circuit board, it being possible for the holes which are required merely for through-plating to be made as small as is technologically possible. Since, moreover, a double-sided population of the printed circuit board is also possible, a considerable space saving and a major reduction in costs can be obtained by surface mounting. A particularly small structural height of the electronic component is produced in this case if the electrode terminals which penetrate through the chip carrier and are electrically connected to the semiconductor chip are configured in the form of terminal legs. The terminal legs are routed out toward at least two sides of the chip carrier and are bent and cut to form short rocker-shaped terminal stubs.

During the application of surface-mountable semiconductor components on the component-mounting surface of the printed circuit board, it is necessary to take account of the possible buckling of the printed circuit board. The buckling behaviour is principally dictated by tolerances and might otherwise pose problems in the course of component-mounting and during subsequent use of the populated printed circuit board. Owing to the extremely small bottom clearances of the ends of the terminal legs protruding from the side parts of the housing, in the region of 1/10 mm, the mounting of such components on the printed circuit board requires trimming and forming tools of exact operation during the production of the components.

SUMMARY OF THE INVENTION

It is accordingly an object of the invention to provide a component housing for surface mounting of a semiconductor component which overcomes the above-mentioned disadvantages of the prior art devices of this general type, which renders the use of any trimming and forming tools during the component mounting of the printed circuit board unnecessary and, at the same time, enables compensation of tolerance-dictated buckling of the printed circuit board and also of any strain of thermal or mechanical nature experienced by the printed circuit board.

With the foregoing and other objects in view there is provided, in accordance with the invention, in combination with a printed circuit board having a component-mounting surface, a component housing for surface mounting of a semiconductor component on the component-mounting surface of the printed circuit board, including: a chip carrier having a chip carrier area, an edge region, a central region, and outer delimiting areas facing the component-mounting surface of the printed circuit board configured such that a distance between the component-mounting surface of the printed circuit board and the outer delimiting areas increases continuously from the edge region to the central region of the chip carrier; the chip carrier area configured to receive the semiconductor component; and electrode terminals having a surface-mountable configuration penetrating through the chip carrier and electrically connectable to the semiconductor component.

The invention provides for the outer delimiting areas of the chip carrier which are provided facing the component-mounting surface of the printed circuit board, that is to say the mounting plane, are constructed in such a way that the distance between the mounting plane and the outer delimiting areas increases continuously from the edge region to the central region of the chip carrier.

By virtue of the configuration according to the invention, the construction of the lower part of the housing in the shape of a roof results in that it is raised from the component-mounting surface of the printed circuit board. As a result, the use of a trimming and forming tool can be entirely dispensed with and the requirements of the bottom clearance between the underside of the component housing and the component-mounting surface of the printed circuit board are thus also fixed at a less stringent level. Generally, the population of the printed circuit board becomes more favorable since good adhesion of the component-mounting adhesive used during the component-mounting is ensured, possible tolerances of the printed circuit board in the form of buckling are compensated for, and strain of thermal or mechanical nature is counteracted, since contact between the component and the printed circuit board is afforded only by the terminal legs.

A preferred embodiment of the invention provides for the outer delimiting areas of the chip carrier which face the component-mounting surface of the printed circuit board to have an essentially V-shaped profile, as seen from the interior of the chip carrier, in the cross section of the chip carrier. In this case, an exemplary configuration provides for the largest distance between the printed circuit board and the outer delimiting areas of the chip carrier which face the component-mounting surface to have a value of about 0.1 to about 0.5 mm.

Following the principle of the invention, it is provided that the electrode terminals which penetrate through the chip carrier and are electrically connected to the semiconductor chip are configured in the form of terminal legs which are routed out toward at least one side, preferably toward two sides, of the chip carrier and are bent and cut to form short rocker-shaped terminal stubs.

A particularly advantageous embodiment may provide for the chip carrier which is produced from electrically insulating material and, in particular, in one piece, to have a lower part, which is raised relative to the component-mounting surface of the printed circuit board, and side parts disposed on both sides of the lower part. In a particularly preferred embodiment, the bends in the terminal legs are partially or completely accommodated within the side parts of the chip carrier.

By virtue of the partial or complete integration of the bends in the legs within the housing, the housing of the electronic component can have its dimensions even further reduced and, furthermore, the size of the metallic lead frame can be reduced. The provision of the bends in the legs within the SMD housing results in that the creepage paths for corrosive media are considerably lengthened and, consequently, the risk of penetration by chemicals is significantly reduced. At the same time, mechanical anchoring of the terminal legs within the structural part is achieved, which ultimately contributes to enhancing the protection against electrical failure.

A further preferred embodiment may provide for those ends of the terminal legs which protrude from the side parts of the chip carrier have a slight inclination relative to the component-mounting surface of the printed circuit board, in such a way that they extend downward in the direction of the mounting plane, as seen from the central region of the chip carrier.

It is particularly preferred for the chip carrier to be produced in one piece from a thermoplastic material.

Other features which are considered as characteristic for the invention are set forth in the appended claims.

Although the invention is illustrated and described herein as embodied in a component housing for surface mounting of a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
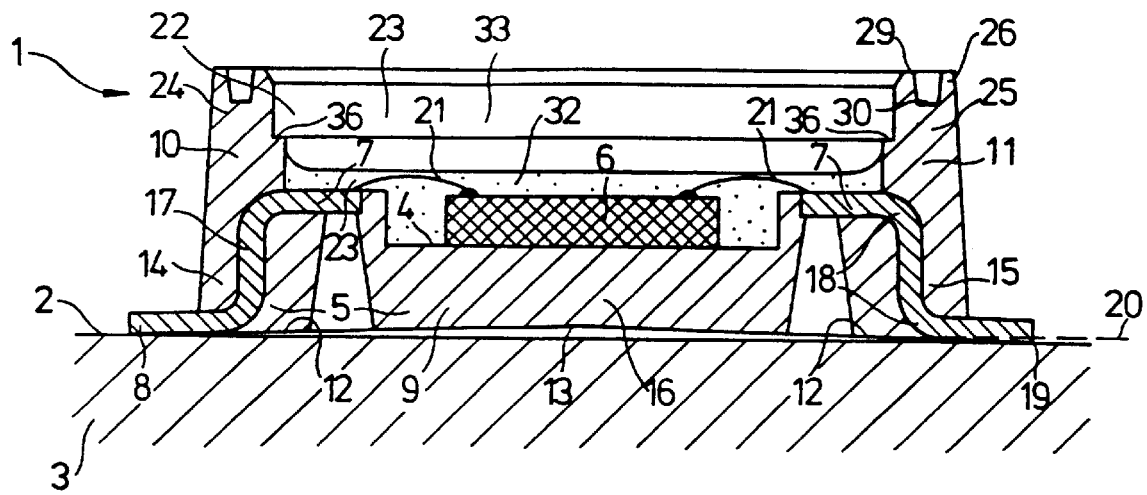
FIG. 1 is a diagrammatic sectional view of a component housing of an exemplary embodiment according to the invention.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of a component housing 1 according to the invention. The component housing has a mounting plane for surface mounting on the component-mounting surface 2 of a printed circuit board 3. The component housing 1 has a chip carrier 5 made of electrically insulating plastic material and having an approximately planar chip carrier area 4, and a semiconductor chip 6 having an integrated pressure sensor and an electronic circuit assigned thereto being secured on said chip carrier area 4. The pressure sensor and the electronic circuit are not more specifically illustrated in the figures. The component housing 1 has electrode terminals 7, which penetrate through the chip carrier 5 and are electrically connected to the semiconductor chip 6 and whose ends 8 are placed onto pads (not specifically illustrated) on the component-mounting surface 2 of the printed circuit board 3 and are soldered there. The chip carrier 5, which is produced, in particular in one piece, by a plastic moulding process known per se, includes a lower part 9, which is raised relative to the mounting plane and, consequently, relative to the component-mounting surface 2 and on which the semiconductor chip 6 is supported, and also side parts 10, 10a and 11, 11a, which are disposed to the sides of the lower part 9 and form the laterally terminating housing walls of the pressure sensor housing. The chip carrier 5 is constructed according to the manner which is illustrated essentially to scale in FIG. 1, in such a way that the distance between the component-mounting surface 2 of the printed circuit board 3 and the outer delimiting areas 12, 13 of the chip carrier 5 which face the component-mounting surface 2 of the printed circuit board 3 increases continuously from the lower edge regions 14, 15 to the central region 16 of the chip carrier 5. In particular, the outer delimiting areas 12, 13 of the chip carrier 5 have, seen in cross section, an essentially inverted V-shaped profile, or roof-shaped profile, such that the tip of the inverted V is disposed centrally, the largest distance at this point from the printed circuit board having a value of about 0.1 mm to about 0.5 mm. It is furthermore provided that the electrode terminals 7 which penetrate through the chip carrier 5 and are electrically connected to the semiconductor chip 6 are configured in the form of terminal legs which are routed out toward at least two sides of the chip carrier 5 and are bent and cut to form short rocker-shaped terminal stubs 17. Such a configuration ensures an extremely small structural height of the sensor component. Furthermore, the bends 18 in the terminal legs are accommodated completely within the side parts 10, 11 of the chip carrier 5, which has the advantage that the dimensions of the housing are once again reduced, the size of the lead frame is reduced, and, moreover, the creepage paths for corrosive media are considerably lengthened and, consequently, ingress of chemicals is reduced. Furthermore, such a configuration enables mechanical anchoring of the lead frame or of the electrode terminals 7 within the housing of the structural part and hence an additional increase in the overall mechanical stability. Furthermore, the ends 8 of the terminal legs which protrude from the side parts 10, 11 of the chip carrier 5 have a slight inclination relative to the component-mounting surface 2 of the printed circuit board 3, in such a way that the outermost edge 19 of the end 8 of the terminal legs, the edge facing the component-mounting surface 2, has a distance of about 0.1 mm from the auxiliary plane 20, which is illustrated by a broken line.

This configuration ensures that contact between the component and the component-mounting surface 2 of the printed circuit board 3 is afforded only by the outermost ends 8 of the terminal legs, which, together with the housing configuration illustrated, in which the lower part 9 is configured to be raised from the printed circuit board 3 and the housing is configured in the shape of a roof, as illustrated, takes account of the possible buckling of the printed circuit board 3, and, moreover, problems in the course of mounting the component on the printed circuit board 3 and also during subsequent use of the printed circuit board 3 are avoided. In an advantageous manner, it is possible in this case to dispense with an adjustment by so-called trimming and forming tools that has been necessary to date in the course of component-mounting, and at the same time to take account of the predetermined requirements made of the bottom clearance to be complied with. The component-mounting can be carried out in a more favorable manner since good adhesion of the component-mounting adhesive is ensured and, furthermore, possible tolerances of the printed circuit board 3 with regard to buckling are compensated for, and any strain of thermal and/or mechanical nature is counteracted, since contact with the printed circuit board 3 is afforded only by the terminal legs.

Figure 2:
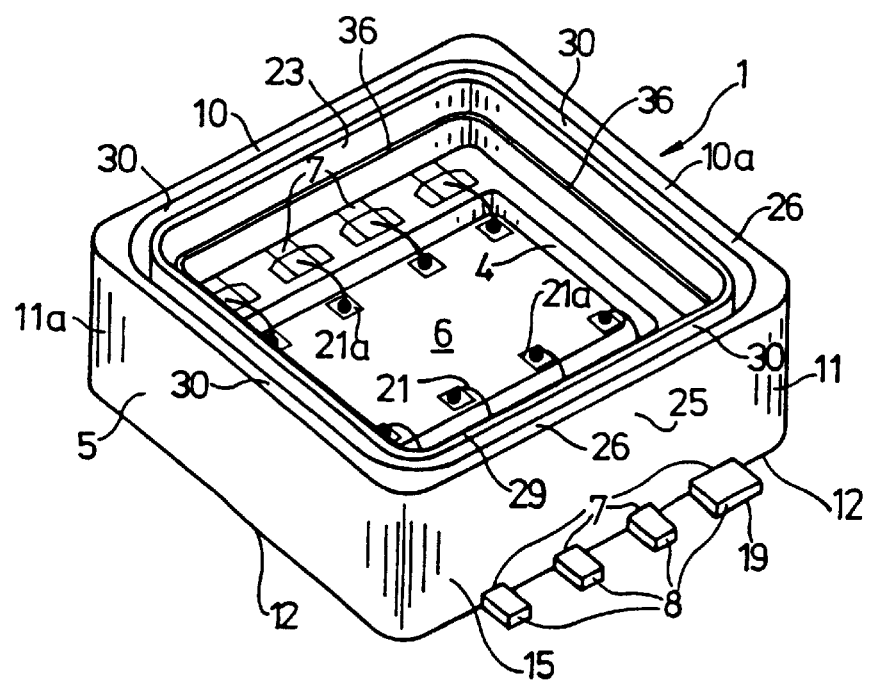
FIG. 2 is a perspective view of a chip carrier of the component housing according to the exemplary embodiment.

For the electrical connection of the pressure sensor integrated on the semiconductor chip 6, and/or of the electronic circuit assigned to the sensor, to the electrode terminals 7, it is possible to use, as illustrated, a wire contact-making method in which bonding wires 21 are secured on metallic chip terminal pads 21a (FIG. 2) on the chip and are pulled to the electrode legs which are to be correspondingly connected. Furthermore, so-called spider contact-making can also be used for this electrical connection, in the case of which bonding wires are replaced by an electrically conductive system carrier plate, a so-called lead frame.

The pressure sensor integrated on the semiconductor chip 6 made of silicon constitutes a so-called piezoresistive sensor, in the case of which a thin silicon diaphragm is provided which is fabricated in the surface of the chip 6 by micromechanical methods and is electrically coupled to pressure-dependent resistors which are likewise formed in the silicon substrate and are connected in a bridge circuit in a manner known per se. Likewise integrated in the semiconductor chip 6 is the electronic circuit that is assigned to the sensor and serves for signal conditioning (amplification and correction) but also for adjustment and compensation of the sensor. In comparison with other configurations, such semiconductor pressure sensors on which the invention is ba sed are primarily suitable for those applications in which an extremely small structural size is a matter of importance. That is to say, for example, in the case of pressure measurements in the field of motor vehicles, for example the measurement of brake pressures, tire pressures, combustion chamber pressures and the like. In addition to semiconductor pressure sensors that operate according to the principle of piezoresistive pressure measurement, it is also possible, moreover, to use those that operate with capacitive measurement principles.

In the case of the exemplary embodiment illustrated in FIG. 1, the chip carrier 5 is configured to be open at one side. More specifically, at its side 22 which is remote from the component-mounting surface 2 of the printed circuit board 3, and has upper edge regions 24, 25 bounding an opening 23. The chip carrier 5 has a supporting means 26 for a positively locking mechanical, play-free connection to a holding means of a connection element (not specifically illustrated) which can be placed onto the chip carrier 5, in such a way that when the connection element is placed onto the chip carrier 5, the holding means and the supporting means 26 alternately engage. For this purpose, the supporting means 26 of the chip carrier 5 has, on its outer periphery, a peripheral abutment area 29 which supports the holding means of the connection element. The abutment area 29 can, as illustrated, be constructed in the form of a peripheral groove 30 at the edge region of the chip carrier 5, into which groove 30 a spring formed on the outer periphery of the connection element at least partially engages.

The chip carrier 5 is filled with a flowable filling agent 32, which completely covers the semiconductor chip 6 and constitutes, in particular, a gel which transmits pressures to the semiconductor pressure sensor virtually without delay and also with no errors. The gel 32 serves, on the one hand, to protect the sensitive pressure sensor chip 6 and further, in particular metallic parts of the electronic component, in particular the bonding wires 21, the terminal legs 7 and/or the lead frame, against contact with a medium 33 to be measured. In this way, the gel 32 prevents contamination of the structural part by ions or other harmful constituents of the medium 33, or the risk of corrosion on account of the medium 33. Furthermore, the gel 32 serves as a filling material in order to keep the dead volume between the sensor component and the positioned connection element as small as possible in order to avoid falsification and/or time delays during the measurement of the pressure. To afford further separation of the medium to be measured from the semiconductor chip 6 or those parts of the electronic component which are at risk of corrosion, it is furthermore provided that that side of the connection element which faces the chip carrier 5 is closed off with an elastic diaphragm. The diaphragm is able to pass on the pressure impulse of the medium brought up to the sensor without significant falsification or time delay, but prevents the risk of contamination of a part at risk by ions or other harmful parts of the medium.

The side walls 24, 25 of the chip carrier 5 which is open at one side can, furthermore, be furnished with a flow-stopping edge 36 disposed continuously on the inner side. In this case, the inside of the chip carrier 5 is filled with the gel 32 only up to the height of the flow-stopping edge 36. The flow-stopping edge 36 enables defined stopping of the capillary forces of the adhesive gel 32 and, consequently, prevents undesirable rising of the gel 32 beyond the edges of the housing on account of capillary forces.

In an advantageous manner, given a correspondingly configured arrangement, the flow-stopping edge 36 also makes it possible to keep the effective thickness of the flowable filling agent as small as possible, in order not to excessively greatly worsen the undesirable influence on the measurement sensitivity of the pressure sensor with regard to the pressures and/or accelerations to be measured. The sensitivity being known to decrease with an increasing gel thickness.

We claim:

1. In combination with a printed circuit board having a component-mounting surface, a component housing for surface mounting of a semiconductor component on the component-mounting surface of the printed circuit board, comprising:

a chip carrier having a chip carrier area, an edge region, a central region, and outer delimiting areas facing the component-mounting surface of the printed circuit board configured such that a distance between the component-mounting surface of the printed circuit board and said outer delimiting areas increases continuously from said edge region to said central region of said chip carrier;

said chip carrier area configured to receive the semiconductor component; and electrode terminals having a surface-mountable configuration penetrating through said chip carrier and electrically connectable to the semiconductor component.

2. The component housing according to claim 1, wherein said outer delimiting areas of said chip carrier facing the component-mounting surface of the printed circuit board have an essentially inverted V-shaped profile in cross section of said chip carrier.

3. The component housing according to claim 1, wherein a largest distance between the printed circuit board and said outer delimiting areas of said chip carrier facing the component-mounting surface has a value in the range of about 0.1 to about 0.5 mm.

4. The component housing according to claim 1, wherein said electrode terminals penetrating through said chip carrier and electrically connectable to the semiconductor component are terminal legs routed out toward at least one side of said chip carrier and are bent and cut to form short rocker-shaped terminal stubs.

5. The component housing according to claim 4, wherein said chip carrier is formed of an electrically insulating material and has a lower part raised relative to the component-mounting surface of the printed circuit board, and side parts disposed on both sides of the lower part.

6. The component housing according to claim 5, wherein said chip carrier is formed in one piece.

7. The component housing according to claim 5, wherein said terminal legs each have at least one bend accommodated substantially within said side parts of said chip carrier.

8. The component housing according to claim 5, wherein said terminal legs each have at least one bend accommodated completely within said side parts of said chip carrier.

9. The component housing according to claim 5, wherein said terminal legs have ends, some of said ends of said terminal legs protrude from said side parts of said chip carrier and have a slight inclination relative to the component-mounting surface of the printed circuit board such that they extend downward in a direction of the component-mounting surface of the printed circuit board as seen from said central region of said chip carrier.

10. The component housing according to claim 1, wherein said chip carrier is formed from a thermoplastic material.

* * * * *

UNITED STATES PATENT AND TRADEMARK OFFICE
CERTIFICATE OF CORRECTION

PATENT NO.    : 6,058,020
DATED         : May 2, 2000
INVENTOR(S)   : Jürgen Winterer et al.

It is certified that error appears in the above-identified patent and that said Letters Patent is hereby corrected as shown below:

<u>Title page,</u>
Item [30], should read as follows:

-- Jun. 28, 1996     [DE]    Germany……….. 196 26 082.5
   Jun. 28, 1996     [DE]    Germany……….. 196 26 098.1 --

Signed and Sealed this

Twentieth Day of May, 2003

JAMES E. ROGAN
*Director of the United States Patent and Trademark Office*